(12) United States Patent
Uchikawa

(10) Patent No.: US 9,017,583 B2
(45) Date of Patent: Apr. 28, 2015

(54) PHOTOSENSITIVE RESIN COMPOSITION, AND LIGHT BLOCKING LAYER AND LIQUID CRYSTAL DISPLAY USING THE SAME

(71) Applicant: Cheil Industries Inc., Gumi-si (KR)

(72) Inventor: Kiyoshi Uchikawa, Uiwang-si (KR)

(73) Assignee: Cheil Industries Inc., Gumi-si (KR)

( * ) Notice: Subject to any disclaimer, the term of this patent is extended or adjusted under 35 U.S.C. 154(b) by 141 days.

(21) Appl. No.: 13/913,549

(22) Filed: Jun. 10, 2013

(65) Prior Publication Data

US 2014/0175342 A1 Jun. 26, 2014

(30) Foreign Application Priority Data

Dec. 26, 2012 (KR) .................. 10-2012-0153561

(51) Int. Cl.
| | |
|---|---|
| G02B 5/23 | (2006.01) |
| G03F 7/027 | (2006.01) |
| G03F 7/031 | (2006.01) |
| G03F 7/038 | (2006.01) |
| G03F 7/105 | (2006.01) |
| G02F 1/1335 | (2006.01) |
| G03C 1/00 | (2006.01) |
| G03F 7/00 | (2006.01) |

(52) U.S. Cl.
CPC .......... *G02F 1/133512* (2013.01); *G03F 7/027* (2013.01); *G03F 7/031* (2013.01); *G03F 7/0388* (2013.01); *G03F 7/105* (2013.01)

(58) Field of Classification Search
USPC ............... 252/582, 586; 349/106, 107; 430/7, 430/280.1, 281.1, 285.1, 287.1, 293
See application file for complete search history.

(56) References Cited

U.S. PATENT DOCUMENTS

| | | | |
|---|---|---|---|
| 5,278,009 A | 1/1994 | Iida et al. | |
| 5,721,076 A | 2/1998 | Watanabe et al. | |
| 7,189,489 B2 | 3/2007 | Kunimoto et al. | |
| 7,759,043 B2 | 7/2010 | Tanabe et al. | |
| 2009/0087759 A1 | 4/2009 | Matsumoto et al. | |
| 2010/0188765 A1 | 7/2010 | Matsumoto et al. | |
| 2012/0091407 A1* | 4/2012 | Lee et al. ................... 252/582 |
| 2013/0143158 A1* | 6/2013 | Lee et al. ................. 430/280.1 |

FOREIGN PATENT DOCUMENTS

| | | |
|---|---|---|
| JP | 60-237403 A | 11/1985 |
| JP | 01-152449 A | 6/1989 |
| JP | 01-200353 A | 8/1989 |
| JP | 04-007373 A | 1/1992 |
| JP | 04-091173 A | 3/1992 |
| JP | 04-163552 A | 6/1992 |
| JP | 2878486 A | 12/1992 |
| JP | 2005-099258 A | 4/2005 |
| JP | 2006-036750 A | 2/2006 |
| JP | 2006-162784 A | 6/2006 |
| JP | 2008-179611 A | 8/2008 |
| KR | 1992-0005780 B1 | 7/1992 |
| KR | 1992-7002502 | 9/1992 |
| KR | 1994-0005617 B1 | 6/1994 |
| KR | 1995-7000359 | 1/1995 |
| KR | 1995-0011163 B1 | 9/1995 |
| KR | 10-0228293 B1 | 11/1999 |
| KR | 10-2008-0080208 A | 9/2008 |
| KR | 10-2010-0009549 A | 1/2010 |
| KR | 10-2010-0018483 A | 2/2010 |
| WO | 91/20006 A1 | 12/1991 |
| WO | 94/00801 A1 | 1/1994 |
| WO | 94/14892 A1 | 7/1994 |
| WO | 02/100903 A1 | 12/2002 |
| WO | 2006/018405 A1 | 2/2006 |
| WO | 2007/062963 A1 | 6/2007 |
| WO | 2007/071497 A1 | 6/2007 |

* cited by examiner

*Primary Examiner* — Bijan Ahvazi
(74) *Attorney, Agent, or Firm* — Additon, Higgins & Pendleton, P.A.

(57) ABSTRACT

A photosensitive resin composition includes (A) a photopolymerization initiator including a compound represented by the following Chemical Formula 1, wherein in Chemical Formula 1, each substituent is the same as defined in the detailed description, (B) a binder resin, (C) a photopolymerizable monomer, (D) a colorant, and (E) a solvent, and a light blocking layer and liquid crystal display (LCD) using the same.

[Chemical Formula 1]

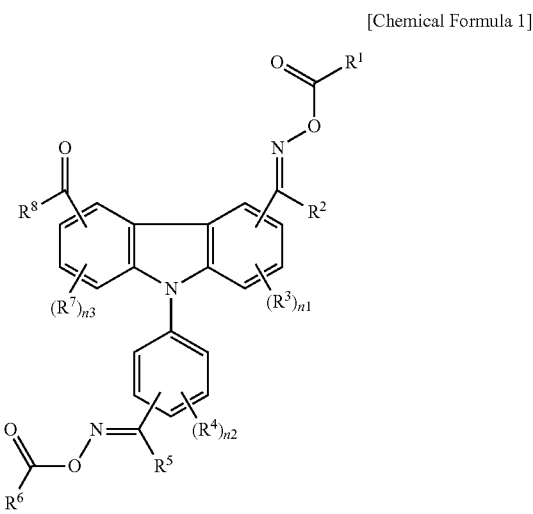

10 Claims, No Drawings

PHOTOSENSITIVE RESIN COMPOSITION, AND LIGHT BLOCKING LAYER AND LIQUID CRYSTAL DISPLAY USING THE SAME

CROSS-REFERENCE TO RELATED APPLICATION

This application claims priority to and the benefit of Korean Patent Application No. 10-2012-0153561 filed in the Korean Intellectual Property Office on Dec. 26, 2012, the entire disclosure of which is incorporated herein by reference.

FIELD

This disclosure relates to a photosensitive resin composition and a light blocking layer and liquid crystal display (LCD) using the same.

BACKGROUND

A liquid crystal display device includes a lower substrate including a light blocking layer, a color filter including a light blocking layer, and an ITO pixel electrode; an active circuit portion including a liquid crystal layer, a thin film transistor, and a capacitor layer; and an upper substrate including an ITO pixel electrode.

The light blocking layer blocks uncontrolled light transmitted out of a transparent pixel electrode of a substrate and thus prevents contrast reduction due to light transmitted through a thin film transistor. Red, green and blue colored layers transmit light with predetermined wavelengths of white light and display colors.

The light blocking layer is generally manufactured by a pigment dispersion method. The pigment dispersion method includes coating a transparent substrate with a colorant-containing photopolymerizable composition, exposing the coating to provide a pattern by thermal curing, and removing non-exposed portions with a solvent.

However, when a photosensitive polyimide or phenol-based resin is used in the pigment dispersion method as a binder resin, high heat resistance may be obtained but sensitivity is lowered and an organic solvent is required as a development solvent. A photoresist using an azide compound has low sensitivity and heat resistance and may be affected by oxygen during exposure.

Also, an acrylic-based resin can have good heat resistance, shrinkage-resistance, chemical resistance, and the like, but reduced sensitivity, developability, and close contacting (adhesion) properties. Since black pigments are included in a large amount in order to adjust optical density of a light blocking layer, sensitivity, developability, and close contacting properties may be significantly deteriorated.

SUMMARY

One embodiment provides a photosensitive resin composition that can have improved sensitivity due to pattern peeling capability and pattern-forming capability and also can have excellent heat resistance and chemical resistance.

Another embodiment provides a light blocking layer manufactured using the photosensitive resin composition.

Yet another embodiment provides a liquid crystal display (LCD) including the light blocking layer.

According to one embodiment, a photosensitive resin composition includes (A) a photopolymerization initiator including a compound represented by the following Chemical Formula 1; (B) a binder resin; (C) a photopolymerizable monomer; (D) a colorant; and (E) a solvent.

[Chemical Formula 1]

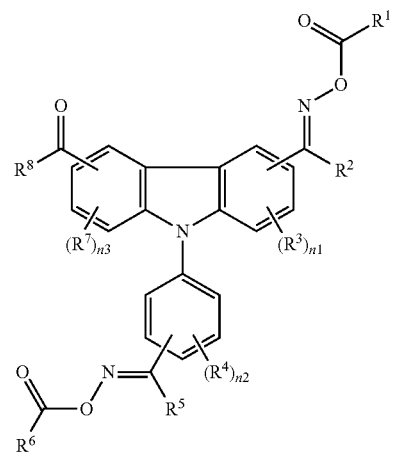

In Chemical Formula 1, $R^1$, $R^3$, $R^4$, $R^6$ and $R^7$ are the same or different and are each independently hydrogen, substituted or unsubstituted C1 to C20 alkyl, substituted or unsubstituted C2 to C20 alkenyl, substituted or unsubstituted C2 to C20 alkynyl, substituted or unsubstituted C1 to C20 alkoxy, substituted or unsubstituted C3 to C20 cycloalkyl, substituted or unsubstituted C3 to C20 cycloalkenyl, substituted or unsubstituted C3 to C20 cycloalkynyl, or substituted or unsubstituted C6 to C30 aryl, $R^2$ and $R^5$ are the same or different and are each independently —ROR', wherein R and R' are the same or different and are each independently substituted or unsubstituted C1 to C20 alkyl, $R^8$ is substituted or unsubstituted C3 to C20 cycloalkyl, substituted or unsubstituted C3 to C20 cycloalkenyl, substituted or unsubstituted C3 to C20 cycloalkynyl, substituted or unsubstituted C2 to C20 heterocycloalkyl, substituted or unsubstituted C2 to C20 heterocycloalkenyl, substituted or unsubstituted C2 to C20 heterocycloalkynyl, substituted or unsubstituted C6 to C30 aryl, or substituted or unsubstituted C2 to C30 heteroaryl, $n^1$ and $n^3$ are the same or different and are each independently integers ranging from 0 to 3, and $n^2$ is an integer ranging from 0 to 4.

In exemplary embodiments, in Chemical Formula 1, $R^8$ can be substituted or unsubstituted C2 to C20 heterocycloalkyl, substituted or unsubstituted C2 to C20 heterocycloalkenyl, substituted or unsubstituted C2 to C20 heterocycloalkynyl, substituted or unsubstituted C6 to C30 aryl, or substituted or unsubstituted C2 to C30 heteroaryl.

The photopolymerization initiator may include at least one selected from compounds represented by the following Chemical Formulae 2 to 6.

[Chemical Formula 2]
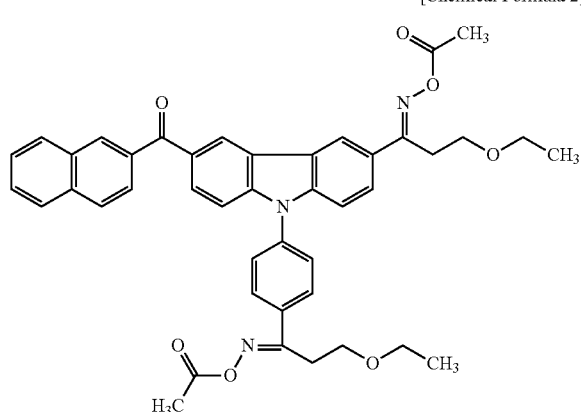
[Chemical Formula 3]
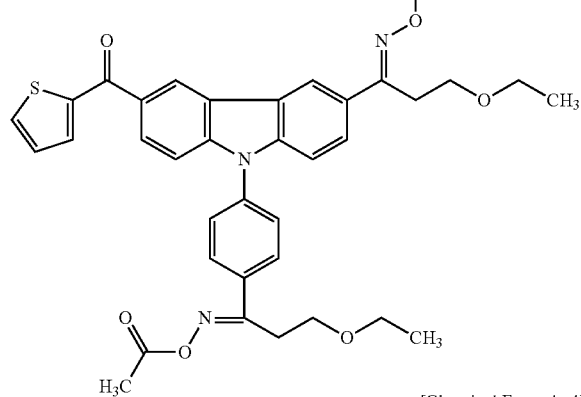
[Chemical Formula 4]
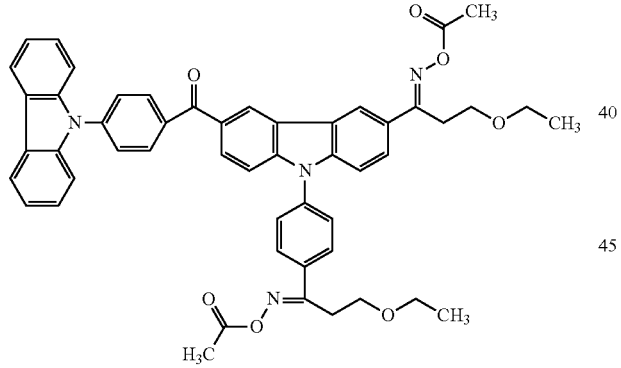
[Chemical Formula 5]
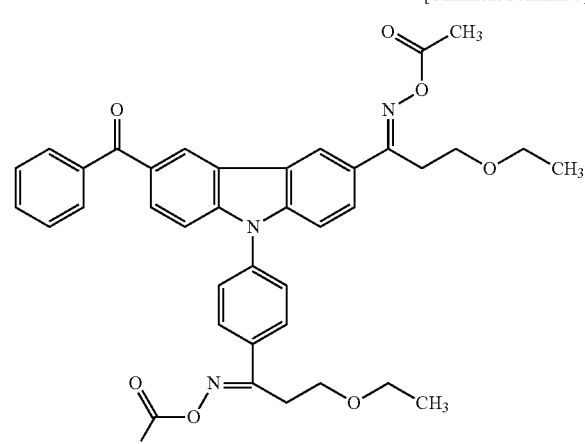
[Chemical Formula 6]
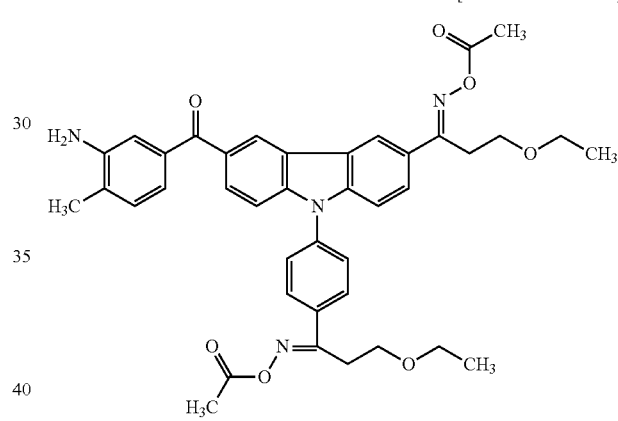
The binder resin may include a cardo-based resin, an acrylic-based resin, or a combination thereof.
The cardo-based resin may include a compound represented by the following Chemical Formula 7.
[Chemical Formula 7]
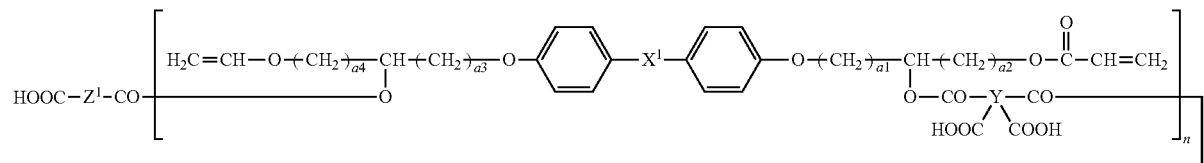
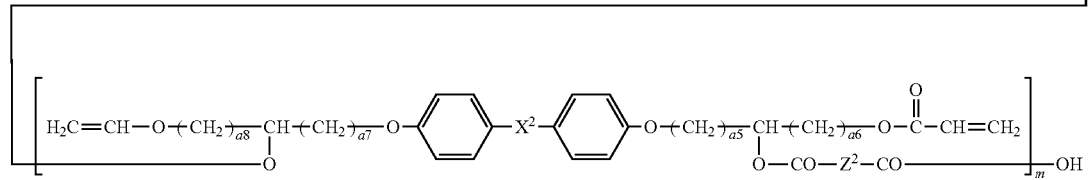

In Chemical Formula 7, $X^1$ and $X^2$ are the same or different and are each independently a single bond, substituted or unsubstituted C1 to C10 alkylene, —O—, —CO—, —COO—, —SO$_2$—, or a linking group selected from the following Chemical Formulae 8 to 19, Y is an acid dianhydride residual group, $Z^1$ and $Z^2$ are the same or different and are each independently an acid anhydride residual group, $a^1$ to $a^8$ are the same or different and are each independently integers ranging from 0 to 10, and n is an integer ranging from 0 to 20, m is 0 or 1, and n+m≥1.

[Chemical Formula 8]

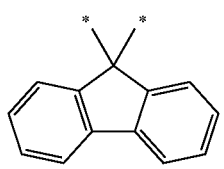

[Chemical Formula 9]

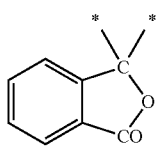

[Chemical Formula 10]

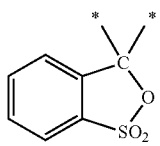

[Chemical Formula 11]

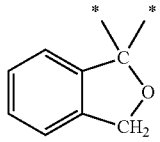

[Chemical Formula 12]

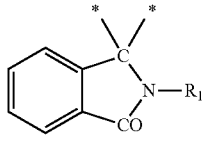

[Chemical Formula 13]

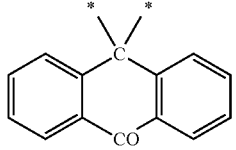

[Chemical Formula 14]

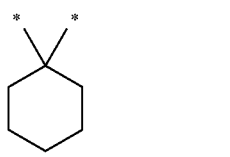

[Chemical Formula 15]

[Chemical Formula 16]

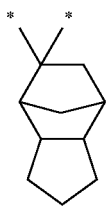

[Chemical Formula 17]

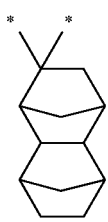

[Chemical Formula 18]

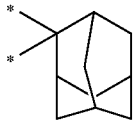

[Chemical Formula 19]

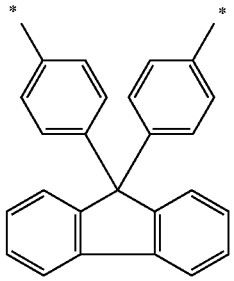

In Chemical Formula 12, $R_f$ is hydrogen, ethyl, —C$_2$H$_4$Cl, —C$_2$H$_4$OH, —CH$_2$CH=CH$_2$, or phenyl.

The colorant may include a dye, a pigment, or a combination thereof.

The pigment may include an organic pigment, an inorganic pigment, or a combination thereof, the organic pigment may include a black organic pigment, and the inorganic pigment may include carbon black, chromium oxide, iron oxide, titan black, titanium carbide, aniline black, or a combination thereof.

The photosensitive resin composition may include about 0.1 to about 10 wt % of the photopolymerization initiator (A); about 5 to about 50 wt % of the binder resin (B); about 1 to about 20 wt % of the photopolymerizable monomer (C); about 1 to about 40 wt % of the colorant (D); and a balance amount of the solvent (E).

According to another embodiment, a light blocking layer manufactured using the photosensitive resin composition is provided.

According to yet another embodiment, a liquid crystal display (LCD) including the light blocking layer is provided.

Hereinafter, other embodiments will be described in detail.

When the photosensitive resin composition is used, a light blocking layer having improved sensitivity due to pattern peeling capability and pattern-forming capability and excellent heat resistance and chemical resistance may be realized.

DETAILED DESCRIPTION

The present invention will be described more fully hereinafter in the following detailed description of the invention, in which some but not all embodiments of the invention are described. Indeed, this invention may be embodied in many different forms and should not be construed as limited to the embodiments set forth herein; rather, these embodiments are provided so that this disclosure will satisfy applicable legal requirements.

As used herein, when a specific definition is not otherwise provided, the term "substituted" refers to one substituted with a substituent including halogen (F, Cl, Br or I), a hydroxyl group, a C1 to C20 alkoxy group, a nitro group, a cyano group, an amine group, an imino group, an azido group, an amidino group, a hydrazino group, a hydrazono group, a carbonyl group, a carbamyl group, a thiol group, an ester group, an ether group, a carboxyl group or a salt thereof, a sulfonic acid group or a salt thereof, a phosphoric acid group or a salt thereof, a C1 to C20 alkyl group, a C2 to C20 alkenyl group, a C2 to C20 alkynyl group, a C6 to C30 aryl group, a C3 to C20 cycloalkyl group, a C3 to C20 cycloalkenyl group, a C3 to C20 cycloalkynyl group, a C2 to C20 heterocycloalkyl group, a C2 to C20 heterocycloalkenyl group, a C2 to C20 heterocycloalkynyl group, a C3 to C30 heteroaryl group, or a combination thereof, instead of at least one hydrogen.

As used herein, when a specific definition is not otherwise provided, the term "hetero" may refer to one including at least one heteroatom including N, O, S, P, or a combination thereof instead of at least one carbon atom of a cyclic group.

As used herein, when a specific definition is not otherwise provided, "(meth)acrylate" refers to both "acrylate" and "methacrylate", and "(meth)acrylic acid" refers to both "acrylic acid" and "methacrylic acid".

The photosensitive resin composition according to one embodiment includes (A) photopolymerization initiator, (B) a binder resin, (C) a photopolymerizable monomer, (D) a colorant and (E) a solvent.

Hereinafter, each component is described in detail.

(A) Photopolymerization Initiator

The photopolymerization initiator produces radicals upon exposure and causes photopolymerization during a pattern-forming process in the photosensitive resin composition.

The photopolymerization initiator may be a compound represented by the following Chemical Formula 1. When the compound represented by the following Chemical Formula 1 is used as a photopolymerization initiator, sensitivity may be improved since absorption wavelength ranges for ultraviolet (UV) at exposure are wide and more ultraviolet (UV) may be used.

[Chemical Formula 1]

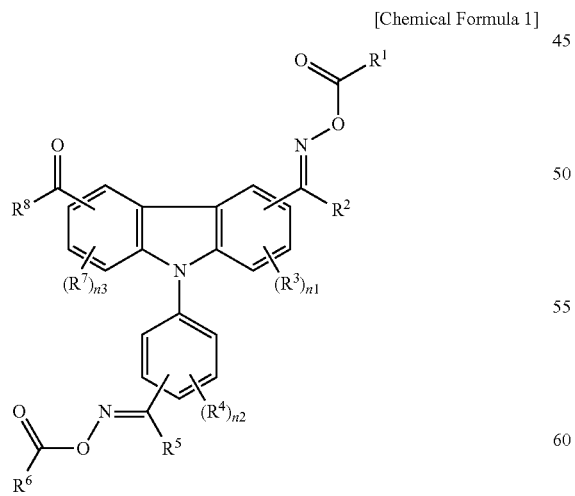

in Chemical Formula 1, $R^1$, $R^3$, $R^4$, $R^6$ and $R^7$ are the same or different and are each independently hydrogen, substituted or unsubstituted C1 to C20 alkyl, substituted or unsubstituted C2 to C20 alkenyl, substituted or unsubstituted C2 to C20 alkynyl, substituted or unsubstituted C1 to C20 alkoxy, substituted or unsubstituted C3 to C20 cycloalkyl, substituted or unsubstituted C3 to C20 cycloalkenyl, substituted or unsubstituted C3 to C20 cycloalkynyl, or substituted or unsubstituted C6 to C30 aryl.

In Chemical Formula 1, $R^2$ and $R^5$ are the same or different and are each independently —ROR', wherein R and R' are the same or different and are each independently substituted or unsubstituted C1 to C20 alkyl, for example R and R' may be substituted or unsubstituted C1 to C10 alkyl.

In Chemical Formula 1, $R^8$ is substituted or unsubstituted C3 to C20 cycloalkyl, substituted or unsubstituted C3 to C20 cycloalkenyl, substituted or unsubstituted C3 to C20 cycloalkynyl, substituted or unsubstituted C2 to C20 heterocycloalkyl, substituted or unsubstituted C2 to C20 heterocycloalkenyl, substituted or unsubstituted C2 to C20 heterocycloalkynyl, substituted or unsubstituted C6 to C30 aryl, or substituted or unsubstituted C2 to C30 heteroaryl. In exemplary embodiments, $R^8$ may be substituted or unsubstituted C2 to C20 heterocycloalkyl, substituted or unsubstituted C2 to C20 heterocycloalkenyl, substituted or unsubstituted C2 to C20 heterocycloalkynyl, substituted or unsubstituted C6 to C30 aryl, or substituted or unsubstituted C2 to C30 heteroaryl.

In Chemical Formula 1 $n^1$ and $n^3$ are the same or different and are each independently integers ranging from 0 to 3, and $n^2$ is an integer ranging from 0 to 4.

Examples of the photopolymerization initiator may include without limitation at least one, or a combination of, compounds represented by the following Chemical Formulae 2 to 6.

[Chemical Formula 2]

[Chemical Formula 3]

[Chemical Formula 4]

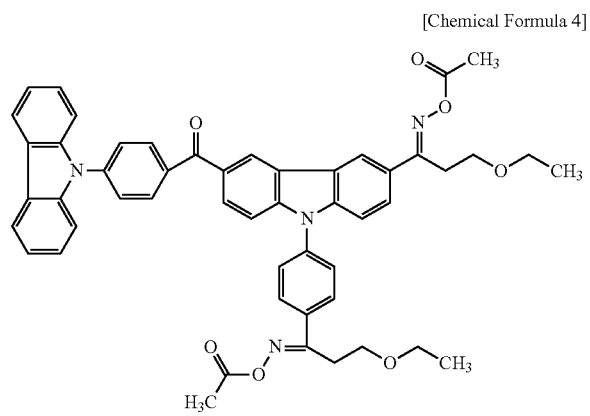

[Chemical Formula 5]

[Chemical Formula 6]

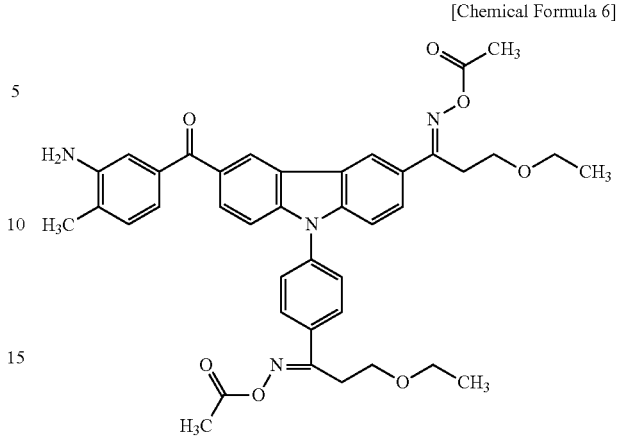

The photosensitive resin composition may include the photopolymerization initiator in an amount of about 0.1 to about 10 wt %, for example about 0.5 to about 7 wt %, based on the total amount (weight) of the photosensitive resin composition. In some embodiments, the photosensitive resin composition may include the photopolymerization initiator in an amount of about 0.1, 0.2, 0.3, 0.4, 0.5, 0.6, 0.7, 0.8, 0.9, 1, 2, 3, 4, 5, 6, 7, 8, 9, or 10 wt %. Further, according to some embodiments of the present invention, the amount of the photopolymerization initiator can be in a range from about any of the foregoing amounts to about any other of the foregoing amounts.

When the photopolymerization initiator is included in an amount within the above range, sufficient photopolymerization can be performed at exposure during pattern forming process, and decrease of transmittance due to non-reacting initiators may be prohibited.

(B) Binder Resin

The binder resin may include a cardo-based resin, an acrylic-based resin, or a combination thereof.

The cardo-based resin may be a compound represented by the following Chemical Formula 7.

[Chemical Formula 7]

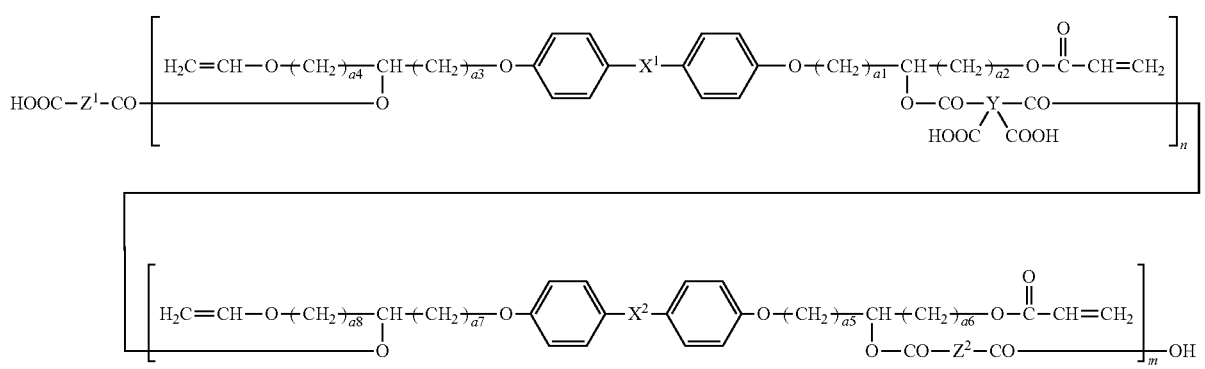

In Chemical Formula 7, $X^1$ and $X^2$ are the same or different and are each independently a single bond, substituted or unsubstituted C1 to C10 alkylene, —O—, —CO—, —COO—, —SO$_2$—, or a linking group selected from the following Chemical Formulae 8 to 19, for example a linking group represented by the following Chemical Formula 8.

[Chemical Formula 8]

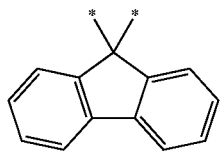

[Chemical Formula 9]

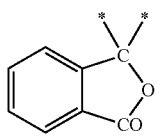

[Chemical Formula 10]

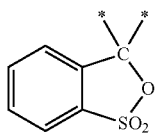

[Chemical Formula 11]

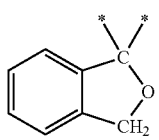

[Chemical Formula 12]

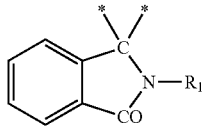

[Chemical Formula 13]

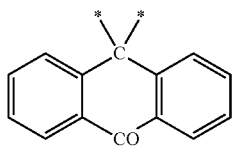

[Chemical Formula 14]

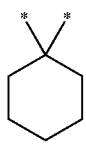

[Chemical Formula 15]

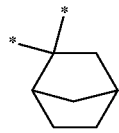

[Chemical Formula 16]

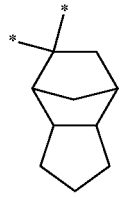

[Chemical Formula 17]

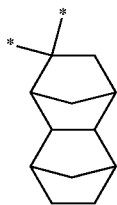

[Chemical Formula 18]

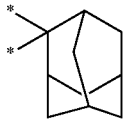

[Chemical Formula 19]

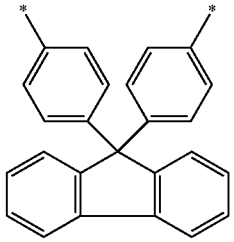

In Chemical Formula 12, $R_f$ is hydrogen, ethyl, —C$_2$H$_4$Cl, —C$_2$H$_4$OH, —CH$_2$CH=CH$_2$, or phenyl.

The cardo-based resin may improve heat resistance, chemical resistance and close contacting (adhesion) properties of the photosensitive resin composition.

In Chemical Formula 7, Y may be an acid dianhydride residual group.

In Chemical Formula 7, $Z^1$ and $Z^2$ may be the same or different and are independently an acid anhydride residual group.

In Chemical Formula 7, $a^1$ to $a^8$ may be the same or different and are independently integers of 0 to 10.

In Chemical Formula 7, n is an integer of 0 to 20, for example 2 to 7, m is 0 or 1, and n+m≥1.

The cardo-based resin may have a weight average molecular weight measured by a gel permeation chromatography (GPC) of about 1,000 to about 15,000 g/mol, for example about 1,500 to about 7,000 g/mol. When the cardo-based resin has a weight average molecular weight within the above range, excellent patterning capability and developability may be provided during manufacture of a light blocking layer.

The acrylic-based resin can be a copolymer of a first ethylenic unsaturated monomer and a second ethylenic unsaturated monomer that is copolymerizable with the first ethylenic unsaturated monomer, and a resin including at least one acrylic-based repeating unit.

The first ethylenic unsaturated monomer is an ethylenic unsaturated monomer including at least one carboxyl group. Examples of the monomer include acrylic acid, methacrylic acid, maleic acid, itaconic acid, fumaric acid, and the like, and combinations thereof.

The acrylic-based resin can include the first ethylenic unsaturated monomer in an amount ranging from about 5 to about 50 wt %, for example from about 10 to about 40 wt %, based on the total amount (weight) of the acrylic-based resin. In some embodiments, the acrylic-based resin can include the first ethylenic unsaturated monomer in an amount of about 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 48, 49, or 50 wt %. Further, according to some embodiments of the present invention, the amount of the first ethylenic unsaturated monomer can be in a range from about any of the foregoing amounts to about any other of the foregoing amounts.

Examples of the second ethylenic unsaturated monomer may include without limitation aromatic vinyl compounds such as styrene, α-methylstyrene, vinyltoluene, vinylbenzylmethylether, and the like; unsaturated carboxylic acid ester compounds such as methyl(meth)acrylate, ethyl(meth)acrylate, butyl(meth)acrylate, 2-hydroxyethyl(meth)acrylate, 2-hydroxy butyl(meth)acrylate, benzyl(meth)acrylate, cyclohexyl(meth)acrylate, phenyl(meth)acrylate, and the like; unsaturated carboxylic acid amino alkyl ester compounds such as 2-aminoethyl(meth)acrylate, 2-dimethylaminoethyl (meth)acrylate, and the like; carboxylic acid vinyl ester compounds such as vinyl acetate, vinyl benzoate, and the like; unsaturated carboxylic acid glycidyl ester compounds such as glycidyl(meth)acrylate and the like; vinyl cyanide compounds such as (meth)acrylonitrile and the like; unsaturated amide compounds such as (meth)acrylamide and the like; and the like. These may be used singularly or as a mixture of two or more.

Examples of the acrylic-based resin may include without limitation a methacrylic acid/benzylmethacrylate copolymer, a methacrylic acid/benzylmethacrylate/styrene copolymer, a methacrylic acid/benzyl methacrylate/2-hydroxyethylmethacrylate copolymer, a methacrylic acid/benzyl methacrylate/styrene/2-hydroxyethylmethacrylate copolymer, and the like. These may be used singularly or as a mixture of two or more.

The acrylic-based resin may have a weight average molecular weight ranging from about 3,000 to about 150,000 g/mol, for example about 5,000 to about 50,000 g/mol, and as another example about 2,000 to about 30,000 g/mol. When the acrylic-based resin has a weight average molecular weight within the above range, the photosensitive resin composition can have good physical and chemical properties, appropriate viscosity, and close contacting (adhesion) properties with a substrate during manufacture of a light blocking layer.

The acrylic-based resin may have a solid acid value of about 50 to about 150 mgKOH/g, for example about 70 to about 120 mgKOH/g. When the acrylic-based resin has an acid value within the above range, excellent pixel resolution may be realized.

The photosensitive resin composition may include the binder resin in an amount of about 5 to about 50 wt %, for example about 10 to about 30 wt %, based on the total amount (weight) of the photosensitive resin composition. In some embodiments, the photosensitive resin composition may include the binder resin in an amount of about 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 48, 49, or 50 wt %. Further, according to some embodiments of the present invention, the amount of the binder resin can be in a range from about any of the foregoing amounts to about any other of the foregoing amounts.

When the binder resin is included in an amount within the above range, patterning capability, processability, and developability can be improved during manufacture of the light blocking layer due to appropriate viscosity.

(C) Photopolymerizable Monomer

The photopolymerizable monomer is a compound that is photopolymerized by the photopolymerization initiator.

The photopolymerizable monomer may be a mono-functional and/or multi-functional ester of (meth)acrylic acid including at least one ethylenic unsaturated double bond.

The photopolymerizable monomer causes sufficient polymerization at exposure during pattern forming processes to form patterns that can have excellent heat resistance, light resistance, and chemical resistance, due to the ethylenic unsaturated double bond.

Examples of the photopolymerizable monomer may include without limitation ethylene glycol di(meth)acrylate, diethylene glycol di(meth)acrylate, triethylene glycol di(meth)acrylate, propylene glycol di(meth)acrylate, neopentyl glycol di(meth)acrylate, 1,4-butanediol di(meth)acrylate, 1,6-hexanediol di(meth)acrylate, bisphenolA di(meth)acrylate, pentaerythritol di(meth)acrylate, pentaerythritol tri (meth)acrylate, pentaerythritol tetra(meth)acrylate, pentaerythritol hexa(meth)acrylate, dipentaerythritol di(meth)acrylate, dipentaerythritol tri(meth)acrylate, dipentaerythritol penta(meth)acrylate, dipentaerythritol hexa(meth)acrylate, bisphenolA epoxy(meth)acrylate, ethylene glycol monomethylether(meth)acrylate, trimethylol propane tri (meth)acrylate, tris(meth)acryloyloxyethyl phosphate, novolacepoxy(meth)acrylate, and the like, and combinations thereof.

Commercially available examples of the photopolymerizable monomer are as follows. The mono-functional (meth)acrylic acid ester may include without limitation Aronix M-101®, M-111®, M-114® (TOAGOSEI CHEMICAL INDUSTRY CO., LTD.); KAYARAD TC-110S®, TC-120S® (NIPPON KAYAKU CO., LTD.); V-158®, V-2311® (OSAKA ORGANIC CHEMICAL IND., LTD.), and the like. Examples of a difunctional (meth)acrylic acid ester may include without limitation Aronix M-210®, M-240®, M-6200® (TOAGOSEI CHEMICAL INDUSTRY CO., LTD.), KAYARAD HDDA®, HX-220®, R-604® (NIPPON KAYAKU CO., LTD.), V-260®, V-312®, V-335 HP® (OSAKA ORGANIC CHEMICAL IND., LTD.), and the like. Examples of a tri-functional (meth)acrylic acid ester may include without limitation Aronix M-309®, M-400®, M-405®, M-450®, M-7100®, M-8030®, M-8060® (TOAGOSEI CHEMICAL INDUSTRY CO., LTD.), KAYARAD TMPTA®, DPCA-20®, DPCA-30®, DPCA-60®, DPCA-120® (NIPPON KAYAKU CO., LTD.), V-295®, V-300®, V-360®, V-GPT®, V-3PA®, V-400® (Osaka Yuki Kayaku Kogyo Co. Ltd.), and the like. The photopolymerizable monomer may be used singularly or as a mixture of two or more.

The photopolymerizable monomer may be treated with acid anhydride to improve developability.

The photosensitive resin composition may include the photopolymerizable monomer in an amount ranging from about 1 to about 20 wt %, for example about 1 to about 15 wt %, based on the total amount (weight) of the photosensitive resin composition. In some embodiments, the photosensitive resin composition may include the photopolymerizable monomer in an amount of about 1, 2, 3, 4, 5, 6, 7, 8, 9, 10, 11, 12, 13, 14, 15, 16, 17, 18, 19, or 20 wt %. Further, according to some embodiments of the present invention, the amount of the photopolymerizable monomer can be in a range from about any of the foregoing amounts to about any other of the foregoing amounts.

When the photopolymerizable monomer is included in an amount within the above range, curing at exposure during pattern forming processes can be sufficiently performed, and thus sensitivity under oxygen and compatibility with the binder resin can be improved.

(D) Colorant

The colorant may include a pigment, a dye, or a combination thereof.

The pigment may include an organic pigment, an inorganic pigment, or a combination thereof. In order to realize high optical density, a mixture of the organic pigment and inorganic pigment may be used.

The organic pigment may be a black organic pigment. The black organic pigment may have insulating properties.

Examples of the black organic pigment may include without limitation perylene black, cyanine black, and the like, which may be used singularly or as a mixture of two or more.

The black organic pigment may be a mixture of two or more kinds of organic pigments to show a black color. Combinations of any pigment showing a black color by mixing in a color coordinate pigment may be used, and for example blackening combinations of at least two selected from a red pigment, a blue pigment, a green pigment, a violet-based pigment, a yellow-based pigment, a cyanine-based pigment, and a magenta-based pigment may be used. For example, a blackening mixture of a red pigment, a blue pigment, and a green pigment may be used, or a blackening mixture of a green pigment and a violet-based pigment may be used.

Examples of the red pigment may include without limitation perylene-based pigments, anthraquinone-based pigments, dianthraquinone-based pigments, azo-based pigments, diazo-based pigments, quinacridone-based pigments, anthracene-based pigments, and the like, and combinations thereof. In exemplary embodiments, examples of the red pigment may include without limitation perylene pigments, quinacridone pigments, naphthol AS, sicomin pigments, anthraquinones (sudan I, II, III, R), bis azos, benzopyranes, and the like, and combinations thereof.

Examples of the blue pigment may include without limitation metal phthalocyanine-based pigments, indanthone-based pigments, indophenol-based pigments, and the like, and combinations thereof. In exemplary embodiments, examples of the blue pigment may include without limitation phthalocyanine metal complexes such as copper phthalocyanine, chloro copper phthalocyanine, chloro aluminum phthalocyanine, titanyl phthalocyanine, vanadic acid phthalocyanine, magnesium phthalocyanine, zinc phthalocyanine, iron phthalocyanine, cobalt phthalocyanine, and the like, and combinations thereof.

Examples of the green pigment may include without limitation halogenated phthalocyanine-based pigments, and the like, and combinations thereof. In exemplary embodiments, examples of the green pigment may include without limitation polychloro copper phthalocyanine, polychloro bromo phthalocyanine, and the like, and combinations thereof.

Examples of the violet-based pigment may include without limitation dioxazine violet, first violet B, methyl violet, indanthrene brilliant violet, and the like, and combinations thereof.

Examples of the yellow-based pigment may include without limitation tetrachloro isoindolinone-based pigments, hansa-based pigments, benzidine yellow-based pigments, azo-based pigments, and the like, and combinations thereof. In exemplary embodiments, examples of the yellow-based pigment may include without limitation hansa yellow (10G, 5G, 3G, G, GR, A, RN, R), benzidine (G, GR), chrome yellow, permanent yellow (FGL, H10G, HR), anthracene, and the like, and combinations thereof.

Examples of the cyanine-based pigment may include without limitation non-metal phthalocyanines, merocyanines, and the like, and combinations thereof.

Examples of the magenta-based pigment may include without limitation dimethyl quinacridone, thio indigo, and the like, and combinations thereof.

Examples of the inorganic pigment may include without limitation carbon black, chromium oxide, iron oxide, titan black, titanium carbide, aniline black, and the like, and combinations thereof. Such an inorganic pigment can have high resistance characteristics, and may be used singularly or in a mixture of two or more kinds.

The organic pigment and inorganic pigment may be mixed in a weight ratio of about 1:1 to about 10:1, for example about 2:1 to about 7:1. Within the weight ratio range, processability may be stable, and a low dielectric constant may be provided.

The photosensitive resin composition may further include a dispersing agent in order to improve dispersion of the pigment.

For example, the pigment may be surface-pretreated with a dispersing agent, or the pigment and dispersing agent may be added together during preparation of the photosensitive resin composition.

Examples of the dye may include without limitation triphenylmethane-based dyes, anthraquinone-based dyes, azo-based dyes, and the like, and combinations thereof. In exemplary embodiments a mixture of the triphenylmethane-based dye and at least one of the anthraquinone-based and azo-based dye may be used.

The photosensitive resin composition may include the colorant in an amount of about 1 to about 40 wt %, for example about 5 to about 30 wt %, based on the total amount (weight) of the photosensitive resin composition. In some embodiments, the photosensitive resin composition may include the colorant in an amount of about 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, or 40 wt %. Further, according to some embodiments of the present invention, the amount of the colorant can be in a range from about any of the foregoing amounts to about any other of the foregoing amounts.

When the colorant is included in an amount within the above range, insulating properties may be improved, and high optical density, and improved processability such as developability, and the like may be provided.

(E) Solvent

Examples of the solvent may include without limitation alcohols such as methanol, ethanol, and the like; ethers such as dichloroethyl ether, n-butyl ether, diisoamyl ether, methylphenyl ether, tetrahydrofuran, and the like; glycol ethers such as ethylene glycol methylether, ethylene glycol dimethylether, ethylene glycol ethylether, propylene glycol monomethylether, and the like; cellosolve acetates such as methyl cellosolve acetate, ethyl cellosolve acetate, diethyl cellosolve acetate, and the like; carbitols such as methylethyl carbitol, diethyl carbitol, diethylene glycol monomethylether, diethylene glycol monoethylether, diethylene glycol dimethylether, diethylene glycol methylethylether, diethylene glycol diethylether, and the like; propylene glycol alkylether acetates such as propylene glycol methylether acetate, propylene glycol propylether acetate, and the like; aromatic hydrocarbons such as toluene, xylene, and the like; ketones such as methylethylketone, cyclohexanone, 4-hydroxy-4-methyl-2-pentanone, methyl-n-propylketone, methyl-n-butylketone, methyl-n-amylketone, 2-heptanone, and the like; saturated aliphatic monocarboxylic acid alkyl ester such as ethyl acetate, n-butyl acetate, isobutyl acetate, and the like; lactate alkyl esters such as methyl lactate, ethyl lactate, and the like; alkyl hydroxy acetate ester such as methyl hydroxyacetate, ethyl hydroxyacetate, butyl hydroxyacetate, and the like; alkoxyalkyl acetate esters such as methoxymethyl acetate, methoxyethyl acetate, methoxybutyl acetate, ethoxymethyl acetate, ethoxyethyl acetate, and the like; alkyl 3-hydroxypropionate ester such as methyl 3-hydroxypropionate, ethyl 3-hydroxypropionate, and the like; alkyl 3-alkoxypropionate esters such as methyl 3-methoxypropionate, ethyl 3-methoxypropionate, ethyl 3-ethoxypropionate, methyl 3-ethoxypropionate, and the like; alkyl 2-hydroxypropionate ester such as methyl 2-hydroxypropionate, ethyl 2-hydroxypropionate, propyl 2-hydroxypropionate, and the like; alkyl 2-alkoxypropionate ester such as methyl 2-methoxypropionate, ethyl 2-methoxypropionate, ethyl 2-ethoxypropionate, methyl 2-ethoxypropionate, and the like; alkyl 2-hydroxy-2-methylpropionate esters such as methyl 2-hydroxy-2-methylpropionate, ethyl 2-hydroxy-2-methylpropionate, and the like; alkyl 2-alkoxy-2-methylpropionate esters such as methyl 2-methoxy-2-methylpropionate, ethyl 2-ethoxy-2-methylpropionate, and the like; esters such as 2-hydroxyethyl propionate, 2-hydroxy-2-methylethyl propionate, hydroxyethyl acetate, methyl 2-hydroxy-3-methylbutanoate, and the like; ketonate esters such as ethyl pyruvate, and the like, and combinations thereof. Additionally, the following solvents may be also used: N-methylformamide, N,N-dimethyl formamide, N-methylformanilide, N-methylacetamide, N,N-dimethyl acetamide, N-methylpyrrolidone, dimethylsulfoxide, benzylethylether, dihexylether, acetylacetone, isophorone, caproic acid, caprylic acid, 1-octanol, 1-nonanol, benzylalcohol, benzyl acetate, ethyl benzoate, diethyl oxalate, diethyl maleate, γ-butyrolactone, ethylene carbonate, propylene carbonate, phenyl cellosolve acetate, and the like, and combinations thereof. These solvents may be used singularly or as a mixture of two or more.

Taking into account miscibility and reactivity, glycol ethers such as ethylene glycol monoethylether, ethylene glycol dimethylether, and the like; ethylene glycol alkylether acetates such as ethyl cellosolve acetate, and the like; esters such as 2-hydroxy ethyl propionate, and the like; diethylene glycols such as diethylene glycol monomethylether, and the like; propylene glycol alkylether acetates such as propylene glycol methylether acetate, propylene glycol propylether acetate, and the like, and combinations thereof may be used.

The photosensitive resin composition may include the solvent in a balance amount, for example about 50 to about 70 wt %, based on the total amount (weight) of the photosensitive resin composition. In some embodiments, the photosensitive resin composition may include the solvent in an amount of about 50, 51, 52, 53, 54, 55, 56, 57, 58, 59, 60, 61, 62, 63, 64, 65, 66, 67, 68, 69, or 70 wt %. Further, according to some embodiments of the present invention, the amount of the solvent can be in a range from about any of the foregoing amounts to about any other of the foregoing amounts.

When the solvent is included in an amount within the above range, the photosensitive resin composition may have an appropriate viscosity resulting in improvement of processability.

(F) Other Additive(s)

The photosensitive resin composition may further include one or more other additives. Examples of the additives include without limitation malonic acid; 3-amino-1,2-propanediol; silane-based coupling agents including a vinyl group or a (meth)acryloxy group; leveling agents; fluorine-based surfactants; radical polymerization initiators, and the like, and combinations thereof. The additives can help prevent stains and/or spots during the coating, adjust leveling, and/or prevent pattern residue due to non-development.

Examples of the silane-based coupling agent may include without limitation trimethoxysilyl benzoic acid, γ-methacryl oxypropyl trimethoxysilane, vinyl triacetoxysilane, vinyl trimethoxysilane, γ-iso cyanate propyl triethoxysilane, γ-glycidoxy propyl trimethoxysilane, β(3,4-epoxycyclohexy)ethyltrimethoxysilane, and the like. They may be used singularly or as a mixture of two or more.

Examples of the fluorine-based surfactant may include without limitation commercial products, for example BM-1000®, and BM-1100® (BM Chemie Inc.); MEGAFACE F 142D®, F 172®, F 173®, and F 183® DAINIPPON INK KAGAKU KOGYO CO., LTD.); FULORAD FC-135®, FULORAD FC-170C®, FULORAD FC-430®, and FULORAD FC-431® (SUMITOMO 3M CO., LTD.); SURFLON S-112®, SURFLON S-113®, SURFLON S-131®, SURFLON S-141®, and SURFLON S-145® (ASAHI GLASS CO., LTD.); and SH-28PA®, SH-190®, SH-193®, SZ-6032®, and SF-8428®, and the like (TORAY SILICONE CO., LTD.), and the like, and combinations thereof.

The amount of the additive(s) may be easily adjusted depending on desired properties.

According to another embodiment, a light blocking layer manufactured using the photosensitive resin composition is provided.

The light blocking layer may be manufactured as follows.

(1) Coating and Film Formation

The photosensitive resin composition can be coated to have a desired thickness, for example, a thickness ranging from about 0.5 to about 25 μm, on a substrate which undergoes a predetermined pretreatment, using a spin or slit coating method, a roll coating method, a screen-printing method, an applicator method, and the like. Then, the coated substrate can be heated at a temperature ranging from about 70 to about 110° C. for about 1 to about 10 minutes to remove a solvent.

(2) Exposure

The resultant film can be radiated by an active ray of about 190 to about 500 nm after putting a mask with a predetermined shape to form a desired pattern. The radiation can be performed by using a light source such as a mercury lamp with a low pressure, a high pressure, or an ultrahigh pressure, a metal halide lamp, an argon gas laser, and the like. An X ray, an electron beam, and the like may be also used.

The exposure process can use, for example, a light dose of about 500 mJ/cm$^2$ or less (with a about 365 nm sensor) when a high pressure mercury lamp is used. However, the light dose may vary depending on kinds of each component of the photosensitive resin composition, its combination ratio, and a dry film thickness and can be readily determined by the skilled artisan without undue experimentation.

(3) Development

After the exposure process, an alkali aqueous solution can be used to develop the exposed film by dissolving and removing an unnecessary part except the exposed part, forming an image pattern.

(4) Post-Treatment

The developed image pattern may be heated again or radiated by an active ray and the like for curing, in order to accomplish excellent quality in terms of heat resistance, photo resistance, close contacting properties, crack-resistance, chemical resistance, high strength, storage stability, and the like.

Therefore, the photosensitive resin composition may exhibit excellent close contacting (adhesive) property and optical density required for a light blocking layer.

According to another embodiment, a liquid crystal display (LCD) including the light blocking manufactured using the photosensitive resin composition is provided.

Hereinafter, the present invention is illustrated in more detail with reference to examples. However, they are exemplary embodiments, and the present invention is not limited thereto.

(Preparation Of Photopolymerization Initiator)

PREPARATION EXAMPLE 1

15 g of phenyl carbazole and 11.75 g of O-naphtoyl chloride are dissolved in 100 ml of dichloromethane. The solution is cooled down to 2° C. in an ice bath and agitated, and then, 10.5 g of AlCl$_3$ is added thereto. The resulting mixture is agitated at room temperature for 3 hours, and a mixture prepared by adding 16.8 g of 1-ethoxy propionyl chloride added in 75 ml of a dichloromethane solution and 15 g of AlCl$_3$ to the mixture is added thereto. The obtained mixture is further agitated for one hour and 30 minutes. The reaction solution is cooled down with an ice, and 700 ml of dichloromethane is added thereto, separating an organic layer. The organic layer is dried with magnesium sulfate to evaporate a solvent therein, obtaining 30 g of a white solid.

The white solid is mixed with 6.5 g of ketone, 1.6 g of NH$_2$OH.HCl, and 2 g of sodium acetate in 60 ml of isopropanol. The mixture is refluxed for 3 hours. The refluxed product is evaporated, and 120 ml of ethyl acetate is added thereto. The obtained product is cleaned with 200 ml of a saturated saline solution, dried with magnesium sulfate to evaporate a solvent therein, obtaining 6 g of a solid. The solid is purified through carboxyl group column chromatography, obtaining 4 g of a crystal.

The crystal 4 g of oxime along with 4 g of acetyl chloride is dissolved in 80 g of dichloromethane, and 5.2 g of triethylamine is added thereto. The mixture is reacted at room temperature for 4 hours. The obtained product is purified through thin layer chromatography to check element loss and then, put in water, and 120 g of dichloromethane is added thereto, separating an organic layer. The organic layer is twice cleaned with a NH$_4$Cl aqueous solution, three times with a 5% Na$_2$CO$_3$ solution, and twice with a saturated saline water and then, dried with sodium sulfate to evaporate a solvent therein. The remaining product is purified through a column of ethyl acetate/hexane=2/1, obtaining 1.5 g of a yellow crystal, which is used to prepare a compound represented by the following Chemical Formula 2.

[Chemical Formula 2]

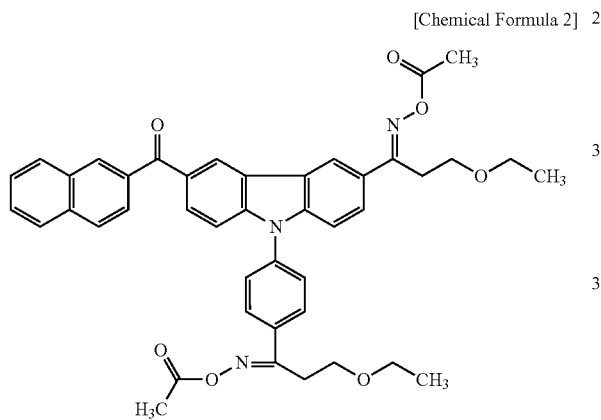

PREPARATION EXAMPLE 2

A compound represented by the following Chemical Formula 3 is prepared according to the same method as Preparation Example 1 except for using 2-thiophenylacetyl chloride instead of O-naphtoyl chloride in Preparation Example 1.

[Chemical Formula 3]

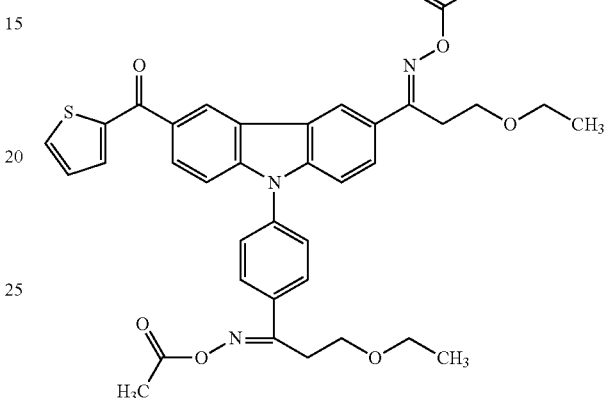

PREPARATION EXAMPLE 3

A compound represented by the following Chemical Formula 4 is prepared according to the same method as Preparation Example 1 except for using 9-carbazolyl benzyl chloride instead of O-naphtoyl chloride in Preparation Example 1.

[Chemical Formula 4]

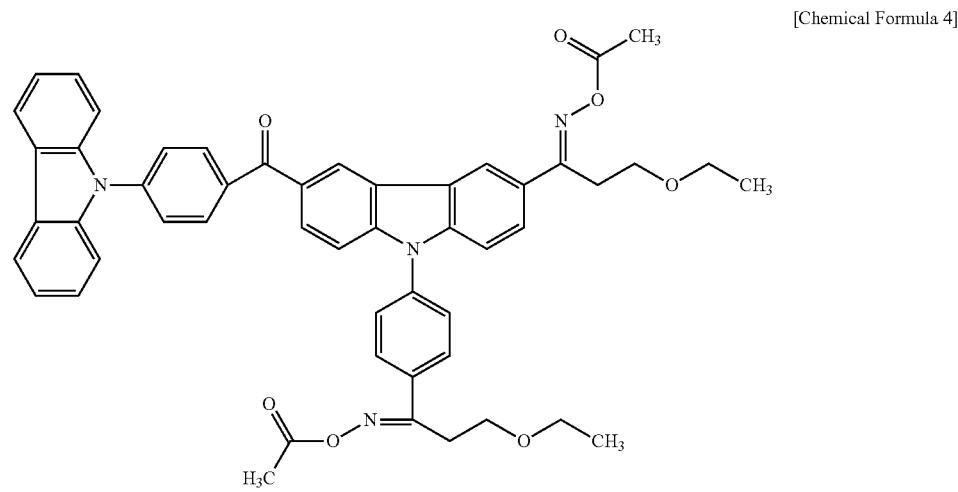 [SMILES: CCOCC/C(=N\OC(C)=O)c1ccc(-n2c3ccc(C(=O)c4ccc(-n5c6ccccc6c6ccccc65)cc4)cc3c3cc(/C(CCOCC)=N/OC(C)=O)ccc32)cc1]

PREPARATION EXAMPLE 4

A compound represented by the following Chemical Formula 20 is prepared according to the same method as Preparation Example 1 except for using 9-carbazolylbenzyl chloride instead of O-naphtoyl chloride and hexanoyl chloride instead of 1-ethoxy propinonyl chloride in Preparation Example 1.

[Chemical Formula 20]

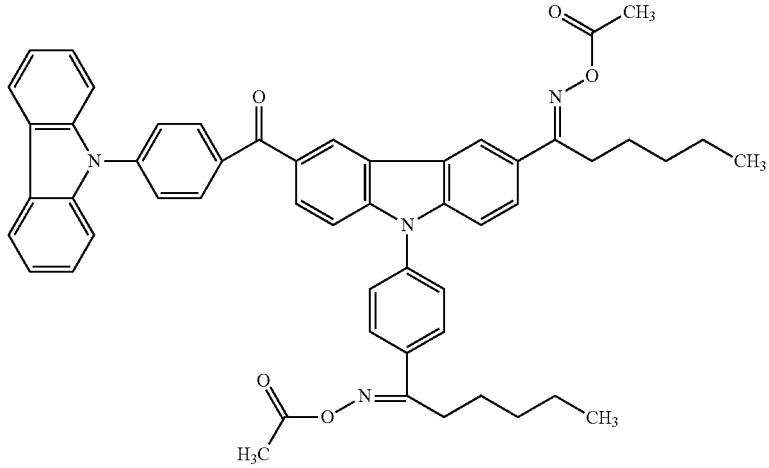

PREPARATION EXAMPLE 5

A compound represented by the following Chemical Formula 21 is prepared according to the same method as Preparation Example 1 except for using butanoyl chloride instead of 1-ethoxy propionyl chloride in Preparation Example 1.

[Chemical Formula 21]

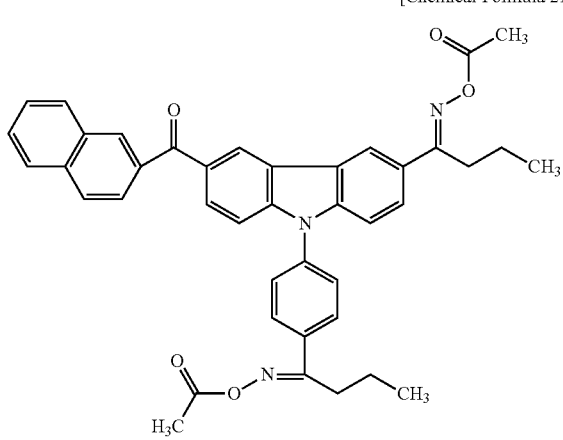

(Preparation of Binder Resin)

PREPARATION EXAMPLE 6

462 g of a bisphenol fluorene epoxy resin (231 g/eq of an epoxy equivalent), 900 mg of triethyl benzyl ammonium chloride, 200 mg of 2,6-diisobutyl phenyl, and 144 g of acrylic acid are put in a 1000 ml four-necked flask and then, heated at a temperature of 90 to 100° C., while air is injected thereinto at a rate of 25 ml/m. The heated solution is slowly heated up to 120° C. in a slightly opaque, leading to a complete dissolution. Then, the solution is measured regarding acid value and then, heated and agitated until the acid value becomes less than 2.0 mgKOH/g. It takes 8 hours until the acid value reached 0.8 mgKOH/g. Next, the solution is cooled down to room temperature, obtaining a transparent colorless solid of bisphenol fluorene epoxy acrylate. Then, propylene glycol monomethylether acetate is dissolved in 152 g of the bisphenol fluorene epoxy acrylate, and a mixture prepared by mixing 19 g of 1,2,3,6-tetrahydro anhydrous phthalic acid, 36.8 g of biphenyltetracarboxylic acid dianhydride, and 0.5 g of bromotetraethylammonium is added thereto. The resulting mixture is slowly heated and reacted at a temperature of 110 to 115° C. for 2 hours, obtaining a cardo-based resin represented by the following Chemical Formula 22.

[Chemical Formula 22]

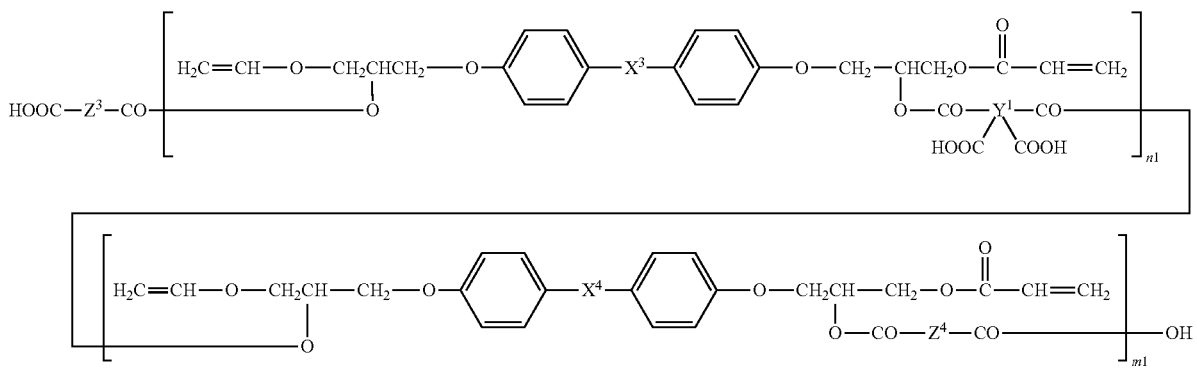

In Chemical Formula 22, $X^3$ and $X^4$ are independently a linking group represented by the following Chemical Formula 8, $Y^1$ is a biphenyl group, $Z^3$ and $Z^4$ are independently a linking group represented by the following Chemical Formula 23, $m^1>0$, and $n^1>0$.

The cardo-based resin represented by the In Chemical Formula 22 has a weight average molecular weight of 4,300 g/mol and a solid acid value of 100 mg KOH/g.

PREPARATION EXAMPLE 7

A cardo-based resin represented by Chemical Formula 24 is prepared according to the same method as Preparation Example 6 except for using benzophenonetetracarboxylic acid dianhydride instead of biphenyltetracarboxylic acid dianhydride in Preparation Example 6.

[Chemical Formula 24]

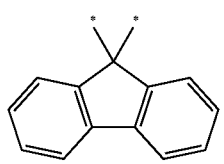

[Chemical Formula 8]

[Chemical Formula 23]

In Chemical Formula 24, $X^5$ and $X^6$ are independently a linking group represented by the following Chemical Formula 8, $Y^2$ is a benzophenone group, $Z^5$ and $Z^6$ are independently a linking group represented by the following Chemical Formula 23, $m^2>0$, and $n^2>0$.

The cardo-based resin represented by the In Chemical Formula 24 has a weight average molecular weight of 4,800 g/mol and a solid acid value of 110 mgKOH/g.

PREPARATION EXAMPLE 8

A cardo-based resin represented by Chemical Formula 26 is prepared according to the same method as Preparation Example 6 except for using 298 g of a biphenyl epoxy resin represented by the following Chemical Formula 25 (149 g/eq of an epoxy equivalent) instead of 462 g of the bisphenol fluorene epoxy resin in Preparation Example 6.

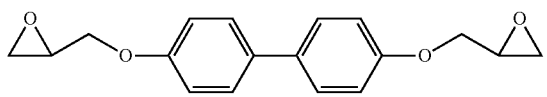

[Chemical Formula 25]

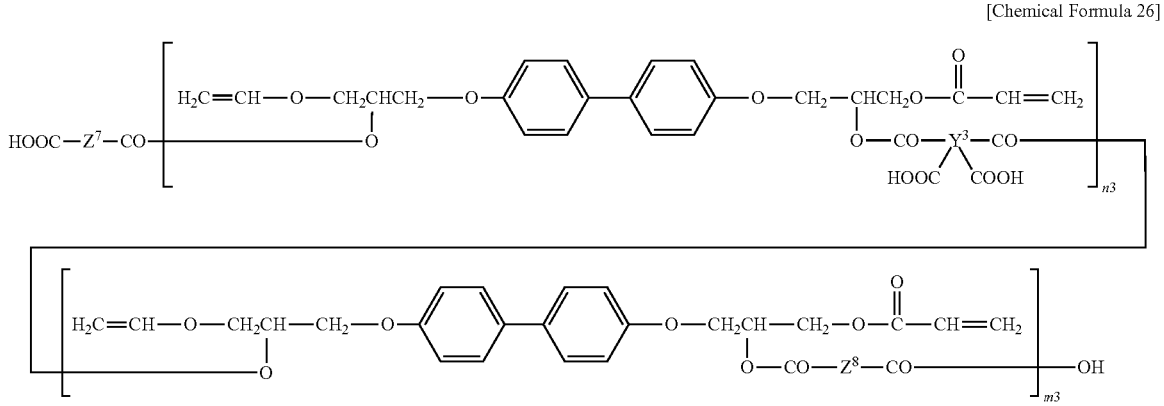

[Chemical Formula 26]

In Chemical Formula 26, $Y^3$ is a biphenyl group, $Z^7$ and $Z^8$ are independently a linking group represented by the following Chemical Formula 23, $m^3>0$, and $n^3>0$.

The cardo-based resin represented by the In Chemical Formula 26 has a weight average molecular weight of 3,800 g/mol and a solid acid value of 110 mg KOH/g.

(Preparation of Photosensitive Resin Composition)

A photosensitive resin composition is prepared using the following components.

(A) Photopolymerization Initiator (A-1) The compound prepared according to Preparation Example 1 is used.

(A-2) The compound prepared according to Preparation Example 2 is used.

(A-3) The compound prepared according to Preparation Example 3 is used.

(A-4) OXE02 made by BASF Co. is used.

(A-5) The compound according to Preparation Example 4 is used.

(A-6) The compound according to Preparation Example 5 is used.

(B) Binder Resin (B-1) The cardo-based resin according to Preparation Example 6 is used.

(B-2) The cardo-based resin according to Preparation Example 7 is used.

(B-3) The cardo-based resin according to Preparation Example 8 is used.

(C) Photopolymerizable Monomer

Dipentaerythritolhexaacrylate is used.

(D) Colorant (D-1) A mill base (CHBK170, Mikuni Co.) including an OBP55 black organic pigment (BASF Co.) is used.

(D-2) A mill base (No3877, Tokushiki Co., Ltd.) including carbon black is used.

(E) Solvent

Propylene glycol monomethylether acetate is used.

EXAMPLES 1 To 6 AND COMPARATIVE EXAMPLES 1 To 3

A photosensitive resin composition is prepared by mixing each component in the following Table 1. Specifically, a thermal curing initiator and a photopolymerization initiator are dissolved in a solvent. The solution is sufficiently agitated at room temperature for about 30 minutes. Next, a binder resin and a photopolymerizable monomer are added to the agitated solution. The mixture is agitated for one hour. Then, an additive is added to the resulting product, and a colorant is added thereto. The mixture is agitated for about 2 hours. The obtained solution is three times filtered to remove impurities, preparing a photosensitive resin composition.

TABLE 1

| | | | | | Examples | | | | | Comparative Examples | | |
|---|---|---|---|---|---|---|---|---|---|---|---|---|
| | | (wt %) | 1 | 2 | 3 | 4 | 5 | 6 | 1 | 2 | 3 |
| (A) photopolymerization initiator | A-1 | | 0.5 | — | — | 0.5 | — | 0.5 | — | — | — |
| | A-2 | | — | 0.5 | — | — | 0.5 | — | — | — | — |
| | A-3 | | — | — | 0.5 | — | — | — | — | — | — |
| | A-4 | | — | — | — | — | — | — | 0.5 | — | — |
| | A-5 | | — | — | — | — | — | — | — | 0.5 | — |
| | A-6 | | — | — | — | — | — | — | — | — | 0.5 |
| (B) binder resin | B-1 | | 4.1 | 4.1 | 4.1 | — | — | — | 4.1 | 4.1 | 4.1 |
| | B-2 | | — | — | — | 4.1 | 4.1 | — | — | — | — |
| | B-3 | | — | — | — | — | — | 4.1 | — | — | — |
| (C) photopolymerizable monomer | | | 2 | 2 | 2 | 2 | 2 | 2 | 2 | 2 | 2 |

TABLE 1-continued

| | | Examples | | | | | | Comparative Examples | | |
|---|---|---|---|---|---|---|---|---|---|---|
| | | 1 | 2 | 3 | 4 | 5 | 6 | 1 | 2 | 3 |
| (D) colorant | D-1 | 20 | 20 | 20 | 20 | 20 | 20 | 20 | 20 | 20 |
| | D-2 | 6.7 | 6.7 | 6.7 | 6.7 | 6.7 | 6.7 | 6.7 | 6.7 | 6.7 |
| (E) solvent | | 66.7 | 66.7 | 66.7 | 66.7 | 66.7 | 66.7 | 66.7 | 66.7 | 66.7 |

(Manufacture of Light Blocking Layer Pattern)

The photosensitive resin compositions according to Examples 1 to 6 and Comparative Examples 1 to 3 are respectively spin-coated to be 1.0 μm thick on a clean glass substrate and dried at 90° C. on a hot plate for 2 minutes. The coated substrates are exposed to a light using an exposure dose of 40 mJ and a mask pattern having a matrix with a line width of 10 μm by mounting a UV filter blocking a wavelength of less than or equal to 350 nm in an proximity exposer made by USHIO Inc. Then, a 0.04% KOH aqueous solution are stabilized to be 23° C. and then, used to spray-develop the exposed substrate with a spray pressure of 1.0 kg/cm² for 60 seconds, obtaining a matrix pattern with a line width of 10 μm.

Evaluation 1: Pattern Peeling Capability

The number of perfectly-remaining matrix patterns out of 100 matrix patterns with a line width of 10 μm is examined with a microscope. The residual rate is calculated and provided in the following Table 2.

Residual rate (%)=(the number of perfectly-remaining matrix patterns/100)×100

<Pattern Residual Rate Evaluation Reference>
⊚: residual rate of 100%
○: residual rate of greater than 90% to less than 100%
: residual rate of greater than 50% to less than or equal to 90%
X: residual rate of less than or equal to 50%

TABLE 2

| | Pattern peeling capability |
|---|---|
| Example 1 | ⊚ |
| Example 2 | ○ |
| Example 3 | |
| Example 4 | ⊚ |
| Example 5 | ○ |
| Example 6 | ○ |
| Comparative Example 1 | X |
| Comparative Example 2 | X |
| Comparative Example 3 | X |

Referring to Table 2, the photosensitive resin compositions including a photopolymerization initiator according to Examples 1 to 6 have excellent pattern-forming capability without delamination or crack of a pattern compared with the ones according to Comparative Examples 1 to 3.

Many modifications and other embodiments of the invention will come to mind to one skilled in the art to which this invention pertains having the benefit of the teachings presented in the foregoing descriptions. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation, the scope of the invention being defined in the claims.

What is claimed is:

1. A photosensitive resin composition, comprising
   (A) a photopolymerization initiator including a compound represented by the following Chemical Formula 1;
   (B) a binder resin;
   (C) a photopolymerizable monomer;
   (D) a colorant; and
   (E) a solvent.

[Chemical Formula 1]

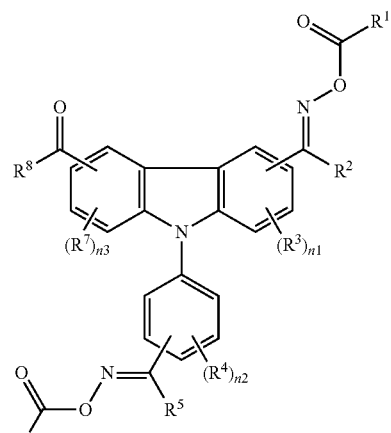

wherein, in Chemical Formula 1, $R^1$, $R^3$, $R^4$, $R^6$ and $R^7$ are the same or different and are each independently hydrogen, substituted or unsubstituted C1 to C20 alkyl, substituted or unsubstituted C2 to C20 alkenyl, substituted or unsubstituted C2 to C20 alkynyl, substituted or unsubstituted C1 to C20 alkoxy, substituted or unsubstituted C3 to C20 cycloalkyl, substituted or unsubstituted C3 to C20 cycloalkenyl, substituted or unsubstituted C3 to C20 cycloalkynyl, or substituted or unsubstituted C6 to C30 aryl, $R^2$ and $R^5$ are the same or different and are each independently —ROR', wherein R and R' are the same or different and are each independently substituted or unsubstituted C1 to C20 alkyl, R⁸ is substituted or unsubstituted C3 to C20 cycloalkyl, substituted or unsubstituted C3 to C20 cycloalkenyl, substituted or unsubstituted C3 to C20 cycloalkynyl, substituted or unsubstituted C2 to C20 heterocycloalkyl, substituted or unsubstituted C2 to C20 heterocycloalkenyl, substituted or unsubstituted C2 to C20 heterocycloalkynyl, substituted or unsubstituted C6 to C30 aryl, or substituted or unsubstituted C2 to C30 heteroaryl, $n^1$ and $n^3$ are the same or different and are each independently integers ranging from 0 to 3, and $n^2$ is an integer ranging from 0 to 4.

2. The photosensitive resin composition of claim 1, wherein in Chemical Formula 1, $R^8$ is substituted or unsubstituted C2 to C20 heterocycloalkyl, substituted or unsubstituted C2 to C20 heterocycloalkenyl, substituted or unsubstituted C2 to C20 heterocycloalkynyl, substituted or unsubstituted C6 to C30 aryl, or substituted or unsubstituted C2 to C30 heteroaryl.

3. The photosensitive resin composition of claim 1, wherein the photopolymerization initiator comprises a compound represented by the following Chemical Formulae 2 to 6, or a combination thereof

[Chemical Formula 2]

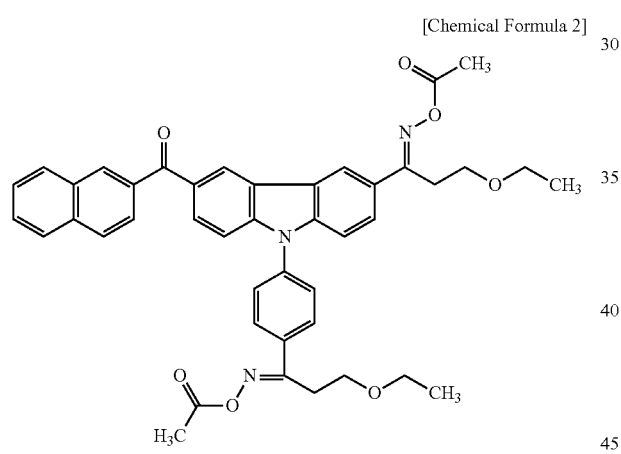

[Chemical Formula 3]

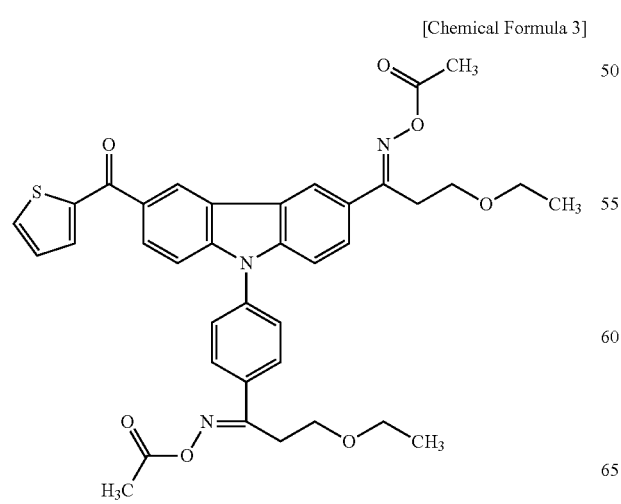

[Chemical Formula 4]

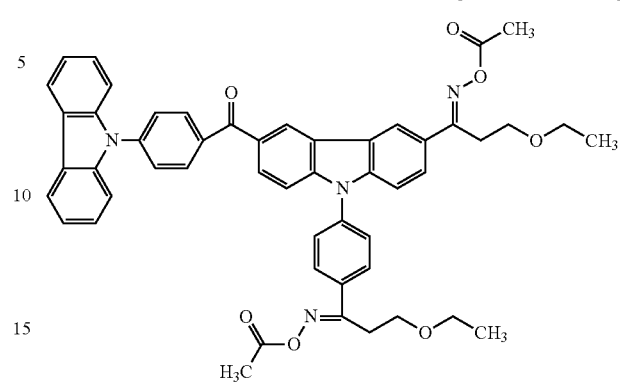

[Chemical Formula 5]

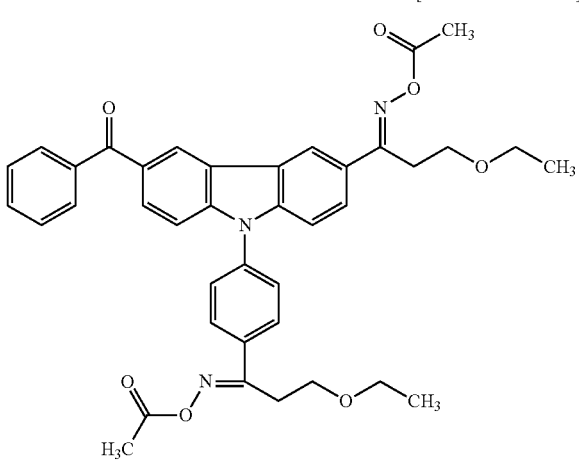

[Chemical Formula 6]

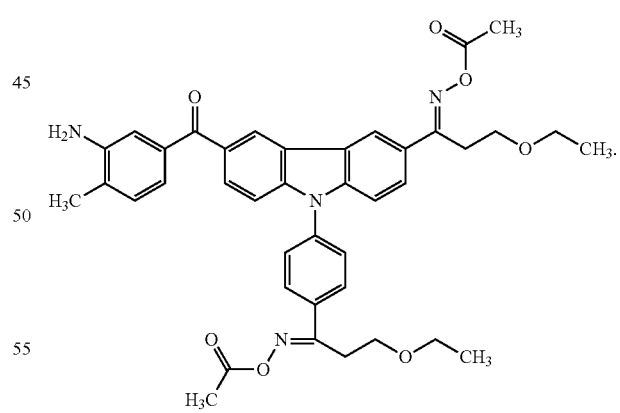

4. The photosensitive resin composition of claim 1, wherein the binder resin comprises a cardo-based resin, an acrylic-based resin, or a combination thereof.

5. The photosensitive resin composition of claim 4, wherein the cardo-based resin comprises a compound represented by the following Chemical Formula 7:

[Chemical Formula 7]

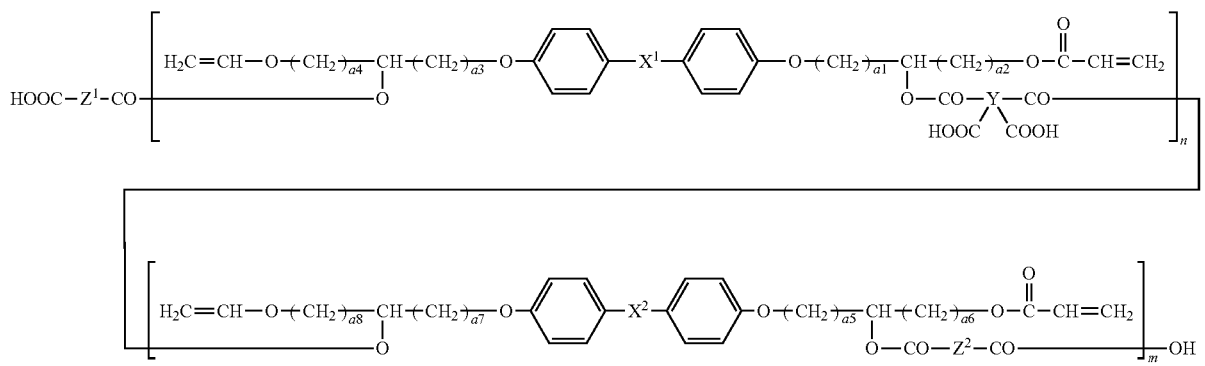

wherein, in Chemical Formula 7, $X^1$ and $X^2$ are the same or different and are each independently a single bond, substituted or unsubstituted C1 to C10 alkylene, —O—, —CO—, —COO—, —SO$_2$—, or a linking group represented by one of the following Chemical Formulae 8 to 19, Y is an acid dianhydride residual group, $Z^1$ and $Z^2$ are the same or different and are each independently an acid anhydride residual group, $a^1$ to $a^8$ are the same or different and are each independently integers ranging from 0 to 10, n is an integer ranging from 0 to 20, m is 0 or 1, and n+m≥1,

[Chemical Formula 8]

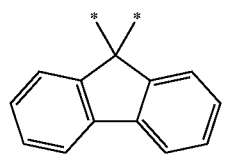

[Chemical Formula 9]

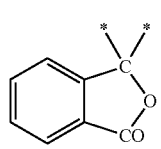

[Chemical Formula 10]

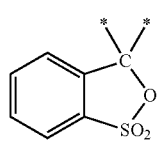

[Chemical Formula 11]

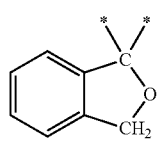

[Chemical Formula 12]

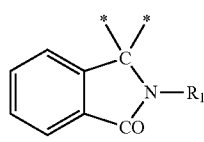

-continued

[Chemical Formula 13]

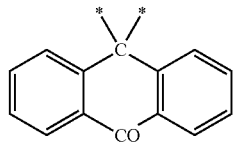

[Chemical Formula 14]

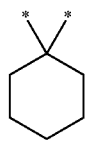

[Chemical Formula 15]

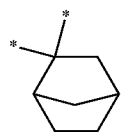

[Chemical Formula 16]

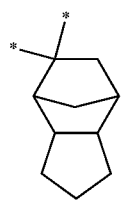

[Chemical Formula 17]

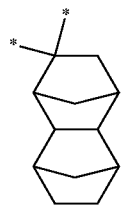

[Chemical Formula 18]

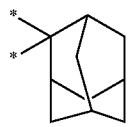

[Chemical Formula 19]

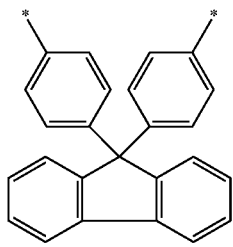

wherein, in Chemical Formula 12,
R$_f$ is hydrogen, ethyl, —C$_2$H$_4$Cl, —C$_2$H$_4$OH, —CH$_2$CH=CH$_2$, or phenyl.

6. The photosensitive resin composition of claim 1, wherein the colorant comprises a dye, a pigment, or a combination thereof.

7. The photosensitive resin composition of claim 6, wherein the pigment comprises an organic pigment, an inorganic pigment, or a combination thereof,
the organic pigment comprises a black organic pigment, and
the inorganic pigment comprises carbon black, chromium oxide, iron oxide, titan black, titanium carbide, aniline black, or a combination thereof.

8. The photosensitive resin composition of claim 1, comprising:
about 0.1 to about 10 wt % of the photopolymerization initiator (A);
about 5 to about 50 wt % of the binder resin (B);
about 1 to about 20 wt % of the photopolymerizable monomer (C);
about 1 to about 40 wt % of the colorant (D); and
a balance amount of the solvent (E).

9. A light blocking layer manufactured using the photosensitive resin composition of claim 1.

10. A liquid crystal display (LCD) comprising the light blocking layer of claim 9.

* * * * *